United States Patent [19]

Koike et al.

[11] 4,354,453

[45] Oct. 19, 1982

[54] SUBSTRATE HOLDER FOR LIQUID PHASE EPITAXIAL GROWTH

[75] Inventors: Susumu Koike, Kawachinagano; Hitoo Iwasa, Ibaraki, both of Japan

[73] Assignee: Matsushita Electric Industrial Co., Ltd., Kadoma, Japan

[21] Appl. No.: 109,110

[22] Filed: Jan. 2, 1980

[30] Foreign Application Priority Data

Jan. 12, 1979 [JP] Japan .................................. 54-3129

[51] Int. Cl.³ .......................... B05C 13/02; B05C 5/00; B05C 3/02; B05C 3/109
[52] U.S. Cl. .................................. 118/426; 118/500; 118/501
[58] Field of Search ............... 118/421, 500, 501, 503, 118/728, 729, 426, 730, 731, 505, 423; 211/40, 41; 148/171, 172; 156/622; 206/0.82, 0.83, 0.84, 332, 334, 445, 455; 134/117, 120; 51/265; 269/902; 432/253, 152, 155, 156, 258, 259

[56] References Cited

U.S. PATENT DOCUMENTS

| 1,941,941 | 1/1934 | Irwin ..................................... 432/259 |
| 2,462,218 | 2/1949 | Olsen ................................. 148/189 X |
| 3,737,282 | 6/1973 | Hearn et al. ........................ 432/253 |
| 3,859,148 | 1/1975 | Dawson et al. ................. 118/171 X |
| 3,918,756 | 11/1975 | Saville et al. .................... 118/500 X |
| 3,974,797 | 8/1976 | Hutson ............................ 118/500 X |
| 4,176,751 | 12/1979 | Gillissie ................................ 211/41 |

FOREIGN PATENT DOCUMENTS 2144678 2/1973 France .............................. 118/728

OTHER PUBLICATIONS

Geany et al., IBM Technical Disclosure Bulletin, vol. 19, No. 6, Nov. 1976.

*Primary Examiner*—John P. McIntosh
*Assistant Examiner*—Bernard F. Plantz
*Attorney, Agent, or Firm*—Cushman, Darby & Cushman

[57] ABSTRACT

A substrate holder for liquid phase epitaxial growth comprising a container having a cylindrical space inside thereof, inside wall of said cylindrical space having one or more annular grooves with V-shaped section to hold one or two of said substrates by receiving therein peripheral edges thereof, pitches of said annular grooves being larger than thickness of said one or two substrates, said container having an opening for putting semiconductor solutions into and out of said cylindrical space therethrough and a detachable part for disposing said substrate therethrough;

thereby making uniformity of boundary conditions of the peripheries of the semiconductor substrates held in the substrate holder, and hence preventing adverse irregular epitaxial growth at the peripheries.

8 Claims, 10 Drawing Figures

SUBSTRATE HOLDER FOR LIQUID PHASE EPITAXIAL GROWTH

BACKGROUND OF THE INVENTION

1. Field of the Invention

The present invention relates to an improvement in a substrate holder for liquid phase epitaxial growth for use in manufacturing semiconductor devices.

Particularly, the present invention concerns an improvement in a substrate holder for holding semiconductor substrate in a liquid phase epitaxial growth process in manufacturing semiconductor devices.

2. Prior Art

Liquid phase epitaxial growth method utilizing gallium as solvent is widely used in forming epitaxial layers such as GaAs, Gap or GaAlAs on a semiconductor substrate. The liquid phase epitaxial growth method is indispensable in manufacturing semiconductor lasers or light emitting diodes.

In such liquid phase epitaxial growth method, semiconductor substrate is covered by a solution containing suitable semiconductor and gallium as solvent. FIG. 1 shows schematic sectional view of a conventional apparatus for liquid phase epitaxial growth having a conventional substrate holder, wherein a substrate holding arm 2 and a substrate holding screw 3 fixed thereto are provided in a container 1, all of them being made of quartz. A semiconductor substrate 4 is held by the screw 3 on the holding arm 2 in the upper part of the container 1, and a semiconductor solution 5 is filled in the lower half part of the container 1. Then, after heating the container 1 at a predetermined temperature, it is turned upside down as shown by an arrow A. Then, the semiconductor substrate 4 is immersed in the solution 5, thereby an epitaxial growth on the substrate 4 is made.

FIG. 2 is a schematic sectional side view of essential part of another example of the conventional way of the epitaxial growth wherein a container 6 of a semiconductor solution 5 is made as a separate body from a substrate holder comprising a substrate holding arm 2 and a holding screw 3. In this second conventional example, a substrate 4 is put into the solution 5 by simply moving down the holding arm 2, and the epitaxial growth is made.

FIG. 3 is an enlarged sectional side view of the substrate holder part, i.e., the screw 3 holding the semiconductor substrate 4 on the holding arm 2. When such holding part is immersed in the solution for the epitaxial growth, due to difference of boundary conditions of the holding part from those of other parts of the substrate, condition of epitaxial growth of the substrate holder part becomes different from those of the abovementioned other parts. Therefore, thickness of the epitaxial layer near the substrate holder part becomes different from those of other parts, or an irregular growth layer 7 is formed near the substrate holder part as shown in FIG. 4 and it necessitates additional steps of removing it in the manufacturing process.

SUMMARY OF THE INVENTION

The present invention can solve the abovementioned problems and increase productivity of the epitaxial growth. More particularly, the apparatus of the present invention has a cylindrical shape, contains a plural number of semiconductor substrates in parallel to each other with their faces perpendicular to the axis of the cylindrical container and has at least an opening to lead semiconductor solution therein.

BRIEF DESCRIPTION OF THE FIGURES

FIG. 6($b$) is a bottom view of the lid of the substrate holder of FIG. 5.

FIG. 8($b$) is a sectional side view, at a sectional plane represented by B—B in FIG. 8($a$), of the substrate holder of FIG. 8($a$).

DESCRIPTION OF THE PREFERRED EMBODIMENT

A substrate holder for liquid phase epitaxial growth in accordance with the present invention comprises a container having a cylindrical space inside thereof, inside wall of said cylindrical space having one or more annular grooves with V-shaped section to hold one or two of said substrates by receiving peripheral edges of the substrate therein, pitches of said annular grooves being larger than thickness of said one or two substrates, said container having an opening for leading semiconductor solutions into and out of said space therethrough and a detachable part for disposing said substrate therethrough.

Figure 1:
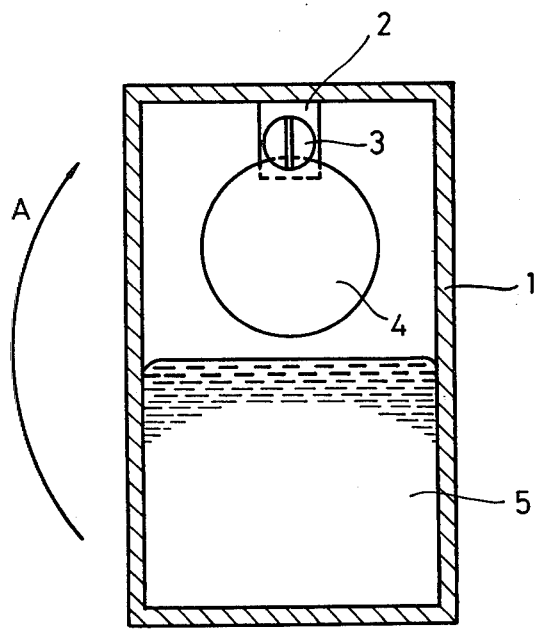
FIG. 1 is the schematic sectional side view of the conventional apparatus for liquid phase epitaxial growth.
Figure 2:
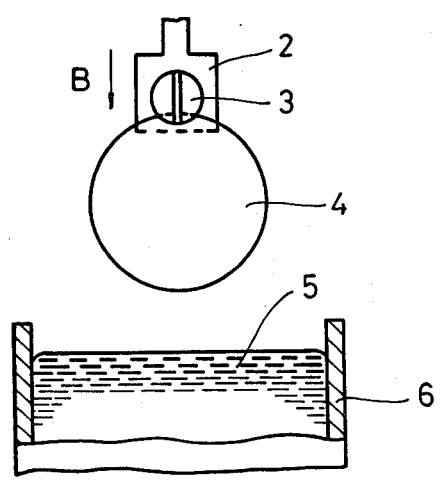
FIG. 2 is the schematic sectional side view of the essential part of the other conventional apparatus for liquid phase epitaxial growth.
Figure 3:
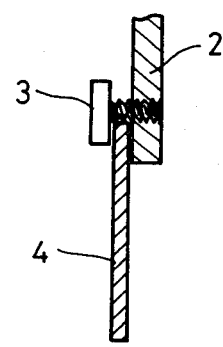
FIG. 3 is the enlarged sectional side view of the substrate holder part of the conventional apparatus for liquid phase epitaxial growth.
Figure 4:
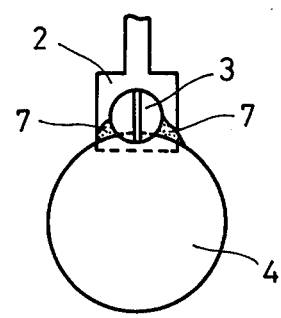
FIG. 4 is the front view of essential part of the conventional apparatus, showing the formation of undesirable irregularly grown layers.
Figure 5:
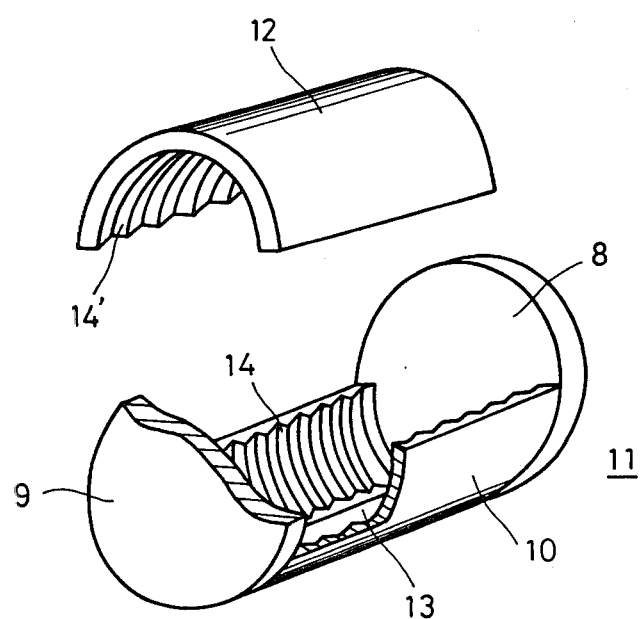
FIG. 5 is an exploded perspective view of a substrate holder embodying the present invention.

FIG. 5 is an exploded perspective view of a substrate holder embodying the present invention, wherein a cylindrical container 11 comprises a semi-cylindrical main part 10 and a semi-cylindrical lid part 12. End discs 8 and 9 are provided on both ends of the main part 10. All the parts are made of quartz, carbon, or alumina. The main part 10 and the lid part 12 defines a cylindrical space therein. A number of annular grooves 14 and 14' are formed substantially parallel to each other on the inside wall of the main part 10 and the lid part 12, respectively. The grooves 14 and 14' are formed so as to continue each other and each to have V-shaped sections. The main part 10 has an opening 13 for putting in and putting out semiconductor solutions therethrough.

When the lid 12 is put on the main part 10, a cylindrical space with annular grooves 14, 14' are formed therein.

FIG. 6($a$) is a plan view of the main part 10 with both end discs 8, and FIG. 6($b$) is a bottom view of the lid part 12. The length $l_2$ of the main part 10 is made almost the same as that of $l_1$ of the lid part 12, and the pitches of the grooves 14 and 14' of the main part and the lid part are designed equal as aforementioned, so that the grooves become continuous except the part of the opening 13.

Figure 6A:
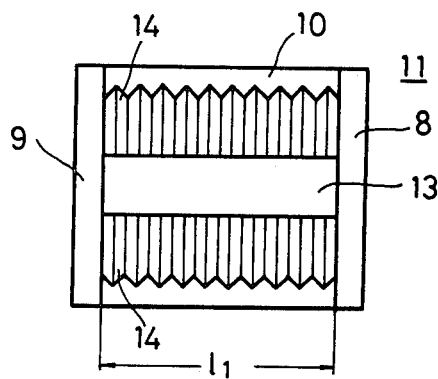
FIG. 6($a$) is a plan view of the substrate holder of FIG. 5 with its lid removed.
Figure 6B:
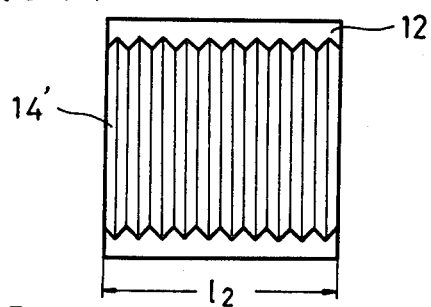
Figure 7:
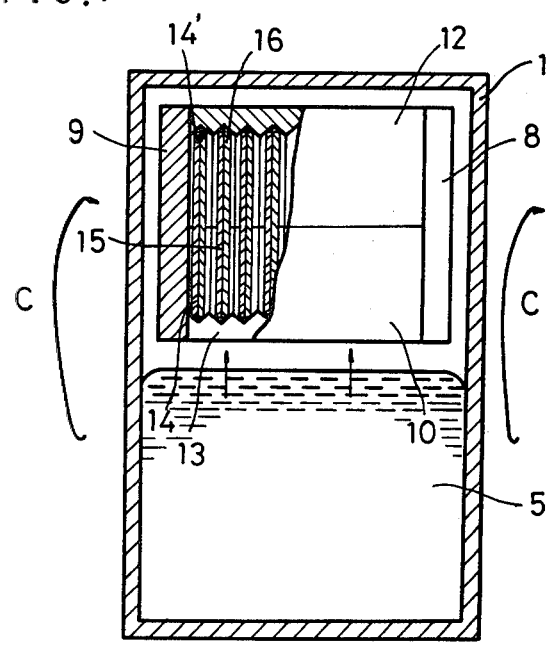
FIG. 7 is a fragmental side view of an apparatus for liquid phase epitaxial growth embodying the present invention.

FIG. 7 shows an example in operation of an apparatus for liquid phase epitaxial growth comprising the substrate holder of FIG. 5, FIG. 6(a) and FIG. 6(b). As shown in FIG. 7, a pair of semiconductor substrates 15 and 16 are put back to back each other and the pairs are disposed in the grooves 14, 14'. Since the semiconductor substrates are held evenly by contacts at edges of all parts of periphery circles, the boundary conditions are all the same at all parts of the periphery circle. Therefore, the epitaxial growth on the substrate is made evenly, and hence the adverse irregular growths are not formed. The substrates 15, 16 held in the grooves 14, 14' are then immersed in a semiconductor solution 5 by, for example, turning a container 1 upside down as shown by arrow C thereby to put the substrate holder 11 into the solution 5. Any other ways of immersing the substrate container in the semiconductor solution can be utilized. The substrate holder in accordance with the present invention has a feature that a number of substrates are held and treated at the same time and putting the substrates into and out of the substrate holder are very easy.

Figure 8A:
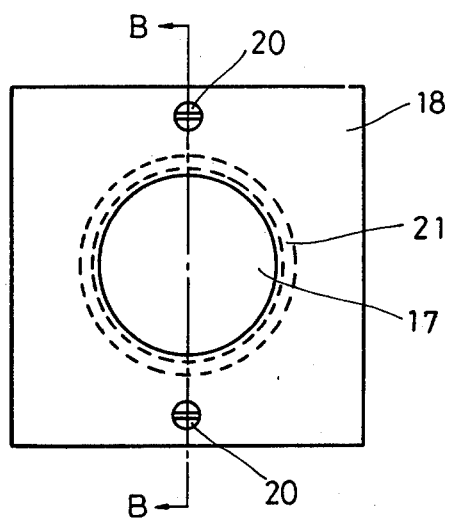
FIG. 8($a$) is a front view of another example of the substrate holder embodying the present invention.
Figure 8B:
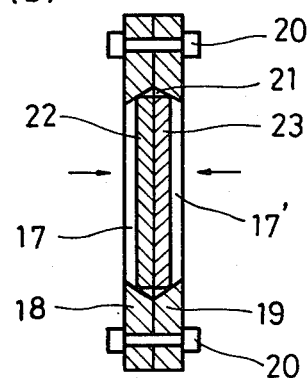

FIG. 8(a) is a front view of another example of the substrate holder embodying the present invention, and FIG. 8(b) is a sectional side view of the substrate holder of FIG. 8(a), wherein a pair of quartz plates 18 and 19 with circular openings 17 and 17' respectively are fixed together by quartz screws 20 and 20'. The openings 17 and 17' cooperatively form a cylindrical space, though short. The opening has a peripheral groove 21 of V-shaped section formed by two tapered peripheries of the openings 17 and 17'. A pair of semiconductor substrates 22 and 23 are disposed back to back and held in the groove 21. When the substrate holder of FIG. 8 is immersed in a semiconductor solution, the solution easily contacts evenly on all parts of the faces of the substrates 22 and 23, up to the peripheral edges of the substrates 22 and 23'. The substrate holder of FIG. 8 is especially suitable for such an apparatus for epitaxial growth that the substrate holder is put downwards into a semiconductor solution reservoir.

What we claim is:

1. An apparatus for liquid phase epitaxial growth comprising, in combination:
    a substrate holder having a cylindrical space inside thereof, the inside wall of said cylindrical space having at least one annular groove with a V-shaped cross-section to hold at least one substrate therein for each annular groove, respectively, by uniformly receiving the peripheral edges of both faces of the substrate, the pitches of each said annular groove being larger than thicknesses of each said substrate,
    said substrate holder including an opening for introducing and withdrawing at least one semiconductor solution into an out of said cylindrical space thereof,
    said substrate holder comprising a semi-cylindrical main part having said at least two annular grooves therein and a semi-cylindrical lid part also having at least two annular grooves therein cooperating therewith, the annular grooves of said lid part having the same pitch as the annular grooves of said main part, whereby when the main part and the lid are put together the correspondingly matched annular grooves are contiguous, establishing uniform boundary conditions around the entire periphery of each said substrate when contacted with the semiconductor solution,
    a boat in liquid communication with said substrate holder via said opening and having a semiconductor solution reservoir at the lower portion thereof with the substrate holder at the upper portion thereof, and
    means to turn said boat upside down thereby contacting said semiconductor solution with each said substrate.

2. An apparatus for liquid phase epitaxial growth comprising, in combination:
    a pair of plates disposed back-to-back with respect to each other, each of said pair of plates having a circular space therein formed by a tapered hole,
    said pair of plates forming a tapered circular peripheral space with a V-shaped annular groove defined by tapered wall faces of said tapered holes,
    a pair of disc-shaped substrates disposed back-to-back in said tapered circular peripheral space in a manner such that the peripheral edges of both opposite faces of said pair of substrates is engaged in the holder by point contact at the peripheral portions of said tapered wall faces, thereby establishing uniform boundary conditions around the entire periphery of each said substrate when contacted with the semiconductor solution,
    a semiconductor solution reservoir disposed under said substrate holder, and
    transport means for bringing said substrate holder down into said semiconductor solution reservoir thereby bringing each substrate into contact with the semiconductor solution.

3. An apparatus for liquid phase epitaxial growth comprising, in combination:
    a container having a cylindrical space inside thereof, the inside wall of said cylindrical space having at least one annular groove with a V-shaped cross section to receive a pair of substrates disposed back-to-back therein for each annular groove, respectively,
    said pair of substrates being disposed in said annular groove in stationary position such that the peripheral edges of both opposite faces of said pair of substrates engage all peripheral places of said annular groove by means of line contact therewith thereby establishing uniform boundary conditions around the entire periphery of each substrate when contacted with the semiconductor solution,
    said container also including an opening for introducing and withdrawing at least one semiconductor solution into an out of said cylindrical space part therethrough, and
    a boat having a semiconductor solution reservoir at the lower part, said substrate holder at the upper part and a turning means which turns said boat upside down thereby bringing the semiconductor solution into contact with each substrate.

4. A substrate holder in accordance with claim 3 wherein said container comprises a semi-cylindrical main part having said at least one annular groove therein and a semi-cylindrical lid part having at least two of said annular grooves therein positioned in a relation such that said grooves of said lid part have the same pitch as the corresponding grooves of said main part thereby defining continuous annular grooves when said lid is jointed with said main part.

5. An apparatus for liquid phase epitaxial growth comprising, in combination:
   a container for holding a plurality of semiconductor discs for epitaxial growth having an internal space for receiving said discs and a plurality of at least substantially annular and adjacent V-shaped grooves extending side by side in an axial direction, each groove being shaped to contact, and thus hold, at least one disc along only an edge of said one disc along substantially all of the groove thereby establishing uniform boundary conditions around the entire periphery of each disc when contacted with a semiconductor solution, and
   a semiconductor solution reservoir disposed below said container, and
   means to invert the position of said container and said reservoir and thereby contact each disc in said container with a semiconductor solution.

6. The apparatus according to claim 5, including a plurality of semiconductor discs in said container.

7. The apparatus according to claim 6, wherein said discs are grouped in pairs and disposed in a parallel, back-to-back relationship one with the other.

8. An apparatus for liquid phase epitaxial growth comprising, in combination:
   a container having a cylindrical space inside thereof, the inside wall of said cylindrical space having at least one annular groove with a V-shaped cross-section to hold at least one substrate disc therein for each annular groove, respectively, by uniformly receiving the peripheral edges of both faces of the substrate disc, the pitches of each said annular groove being larger than thicknesses of each said substrate disc,
   said container including an opening for introducing and withdrawing at least one semiconductor solution into and out of said cylindrical space thereof,
   said container also including at least one pair of plates disposed back-to-back with respect to each other and having circular space with a tapered periphery therebetween such that said tapered peripheries of circular spaces of said plate cooperatively form a V-shaped groove when said plates are disposed together thereby establishing uniform boundary conditions around the periphery thereof when said substrate is brought into contact with the semiconductor solution, and
   a semiconductor solution reservoir disposed below said substrate holder and a transporting means to bring said substrate holder down into said semiconductor solution reservoir thereby contacting each said semiconductor disc with the semiconductor solution.

* * * * *